(12) United States Patent
Procopio et al.

(10) Patent No.: US 11,950,511 B2
(45) Date of Patent: Apr. 2, 2024

(54) MICROMACHINED ULTRASONIC TRANSDUCER (MUT), METHOD FOR MANUFACTURING THE MUT, AND METHOD FOR DESIGNING THE MUT

(71) Applicant: STMICROELECTRONICS S.R.L., Agrate Brianza (IT)

(72) Inventors: Francesco Procopio, Sedriano (IT); Fabio Quaglia, Pizzale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 1449 days.

(21) Appl. No.: 16/277,952

(22) Filed: Feb. 15, 2019

(65) Prior Publication Data

US 2019/0259932 A1 Aug. 22, 2019

(30) Foreign Application Priority Data

Feb. 22, 2018 (IT) .......................... 102018000002952

(51) Int. Cl.
*H01L 41/047* (2006.01)
*B06B 1/02* (2006.01)
(Continued)

(52) U.S. Cl.
CPC ........... *H10N 30/87* (2023.02); *B06B 1/0292* (2013.01); *B06B 1/06* (2013.01); *B06B 1/0622* (2013.01); *G10K 9/125* (2013.01); *G10K 11/02* (2013.01)

(58) Field of Classification Search
CPC .................................. H10N 30/87; B06B 1/06
See application file for complete search history.

(56) References Cited

U.S. PATENT DOCUMENTS 6,585,653 B2 7/2003 Miller
2011/0190669 A1 8/2011 Mi et al.
(Continued)

FOREIGN PATENT DOCUMENTS

CN 1535243 A 10/2004
CN 1294075 C 1/2007
(Continued)

OTHER PUBLICATIONS

Yamashita et al., "Arrayed ultrasonic microsensors with high directivity for in-air use using PZT thin film on silicon diaphragms," *Sensors and Actuators A 97-98*: 302-307, 2002.

*Primary Examiner* — Bryan P Gordon
(74) *Attorney, Agent, or Firm* — Seed IP Law Group LLP

(57) ABSTRACT

A device for emitting an ultrasound acoustic wave in a propagation medium, comprising: a package including a base substrate and a cap coupled to the base substrate and defining therewith a chamber in the package; a semiconductor die, coupled to the base substrate in the chamber, comprising a semiconductor body; a micromachined ultrasonic transducer (MUT) integrated at least in part in the semiconductor body and including a cavity in the semiconductor body and a membrane suspended over the cavity; and an actuator, operatively coupled to the membrane, which can be operated for generating a deflection of the membrane. The membrane is designed in such a way that a resonance frequency thereof matches an acoustic resonance frequency that, during operation of the MUT, develops in said chamber of the package.

24 Claims, 6 Drawing Sheets

(51) Int. Cl.
*B06B 1/06* (2006.01)
*G10K 9/125* (2006.01)
*G10K 11/02* (2006.01)
*H10N 30/87* (2023.01)

(56) References Cited

U.S. PATENT DOCUMENTS

| | | | | |
|---|---|---|---|---|
| 2015/0097468 A1* | 4/2015 | Hajati | ................ | H10N 30/1071 |
| | | | | 310/334 |
| 2015/0260597 A1* | 9/2015 | Pagani | ................ | G01L 27/002 |
| | | | | 29/25.35 |
| 2015/0357375 A1* | 12/2015 | Tsai | ................ | H10N 30/302 |
| | | | | 257/416 |
| 2017/0322290 A1* | 11/2017 | Ng | ................ | A61B 5/1172 |
| 2018/0021813 A1* | 1/2018 | Beckers | ................ | G10K 11/30 |
| | | | | 310/334 |
| 2018/0107854 A1* | 4/2018 | Tsai | ................ | B06B 1/0666 |
| 2018/0178251 A1* | 6/2018 | Foncellino | ................ | B06B 1/0622 |

FOREIGN PATENT DOCUMENTS

| | | | |
|---|---|---|---|
| CN | 107405649 A | 11/2017 | |
| WO | 2016/139103 A1 | 9/2016 | |
| WO | 2018/026657 A1 | 2/2018 | |

* cited by examiner

MICROMACHINED ULTRASONIC TRANSDUCER (MUT), METHOD FOR MANUFACTURING THE MUT, AND METHOD FOR DESIGNING THE MUT

BACKGROUND

Technical Field

The present disclosure relates to a micromachined ultrasonic transducer (MUT), to a method for manufacturing the MUT, and to a method for designing the MUT. In particular, the present disclosure regards a MUT designed and machined so as to take into account the acoustic-resonance modes that are generated, in use, within a package that houses the MUT.

Description of the Related Art

As is known, a transducer is a device that converts a variation of a physical quantity into a variation of an electrical quantity (e.g., a resistance or a capacitance), or vice versa. Ultrasonic transducers are devices that are well known in the prior art and are widely used in non-destructive testing, in speed detection, in industrial automation, in object recognition, in anti-collision systems, and in medical imaging. Micromachined ultrasonic transducers are provided with a vibrating membrane structure, having an appropriate acoustic impedance to guarantee good coupling with a physical medium of interest, for example air or liquids. Vibration of the membrane, under the control of an actuator coupled thereto, causes emission of an ultrasound beam in the medium considered (operation as transmitter). Likewise, reception of an ultrasound acoustic signal induces in the membrane a vibration that is transduced into an electrical signal and then detected (operation as receiver).

MUTs may be divided into two main types, on the basis of the actuation mechanism: capacitive MUTs (CMUTs), and piezoelectric MUTs (PMUTs). In particular, PMUTs of a known type are manufactured according to a process of etching from the back of a semiconductor substrate so as to define a suspended membrane extending on which are the piezoelectric actuators/detectors.

The suspended membrane is driven in oscillation or vibration (for example, with a piston-type movement) at a specific frequency, typically the resonance frequency of the membrane itself which depends upon the constructional characteristics of the membrane (geometry, thickness, diameter, etc.), in a way in itself known.

MUT devices typically include: a transducer, which can be provided in MEMS (Micro-Electro-Mechanical System) technology, i.e., by means of steps of machining of a semiconductor body; and a protective package, which comprises a resting base for the MUT and a cap that jointly define a chamber in which the MUT is housed. The acoustic waves generated by the MUT in use propagate within the chamber of the package and are transmitted to the outside through the cap.

It is known that the shape and size of the inner chamber of the package have a significant impact on the performance of the ultrasonic-transducer device, in particular on the pressure of the wave generated at output and on the bandwidth. In fact, in use, stationary waves are generated within the cavity of the package, giving rise, in a known way, to acoustic-resonance modes. Said acoustic-resonance modes markedly depend upon the geometrical characteristics of the inner cavity of the package and may be identified with currently available simulation and design programs.

BRIEF SUMMARY

The present applicant has found that, on account of the presence of said acoustic-resonance modes, driving of the MUT at its resonance frequency does not necessarily entail a high pressure of the wave generated at output from the package (transmitted useful signal). Instead, there exist operating conditions in which the acoustic-resonance modes internal to the package significantly reduce the pressure of the wave at output.

The difficulties discussed above render design of acoustic-transducer devices particularly complex.

At least some embodiments of the present seek to provide a micromachined ultrasonic transducer (MUT), a method for manufacturing the MUT, and a method for designing the MUT that will enable the disadvantages of the known art to be overcome.

According to the present disclosure, a micromachined ultrasonic transducer (MUT), a method for manufacturing the MUT, and a method for designing the MUT are hence provided.

BRIEF DESCRIPTION OF THE SEVERAL VIEWS OF THE DRAWINGS

For an understanding of the present disclosure preferred embodiments thereof are now described, purely by way of non-limiting example, with reference to the attached drawings, wherein.

DETAILED DESCRIPTION

Figure 1:
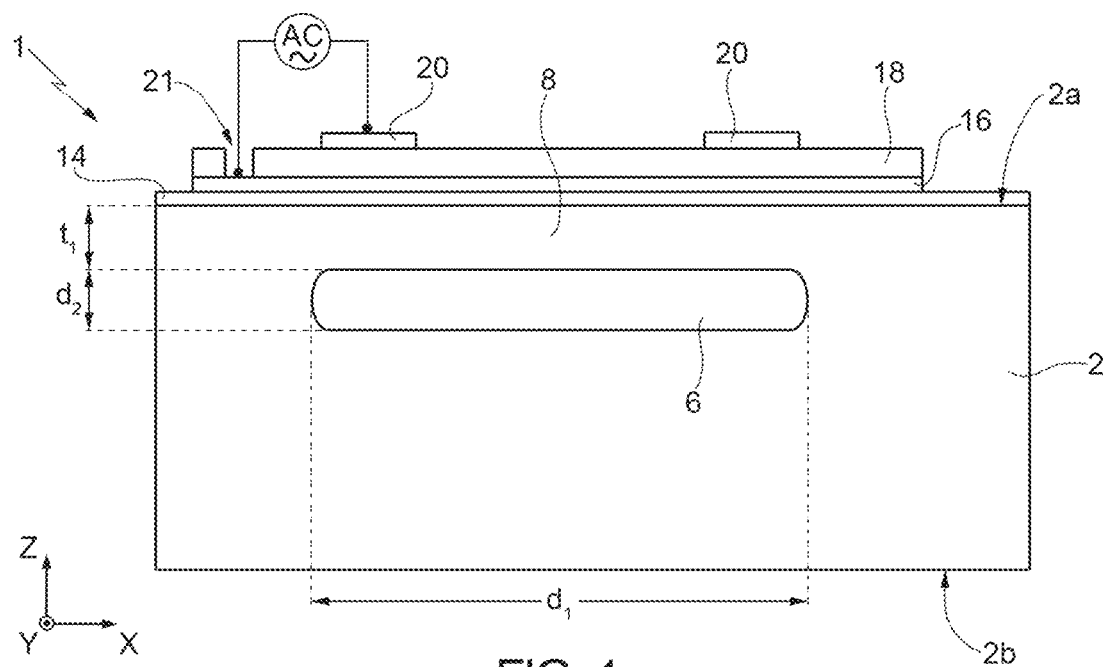
FIG. 1 illustrates a piezoelectric micromachined ultrasonic transducer (PMUT) according to an embodiment of a known type.

FIG. 1 is a lateral sectional view of a piezoelectric micromachined ultrasonic transducer (in what follows, PMUT) 1.

Figure 2:
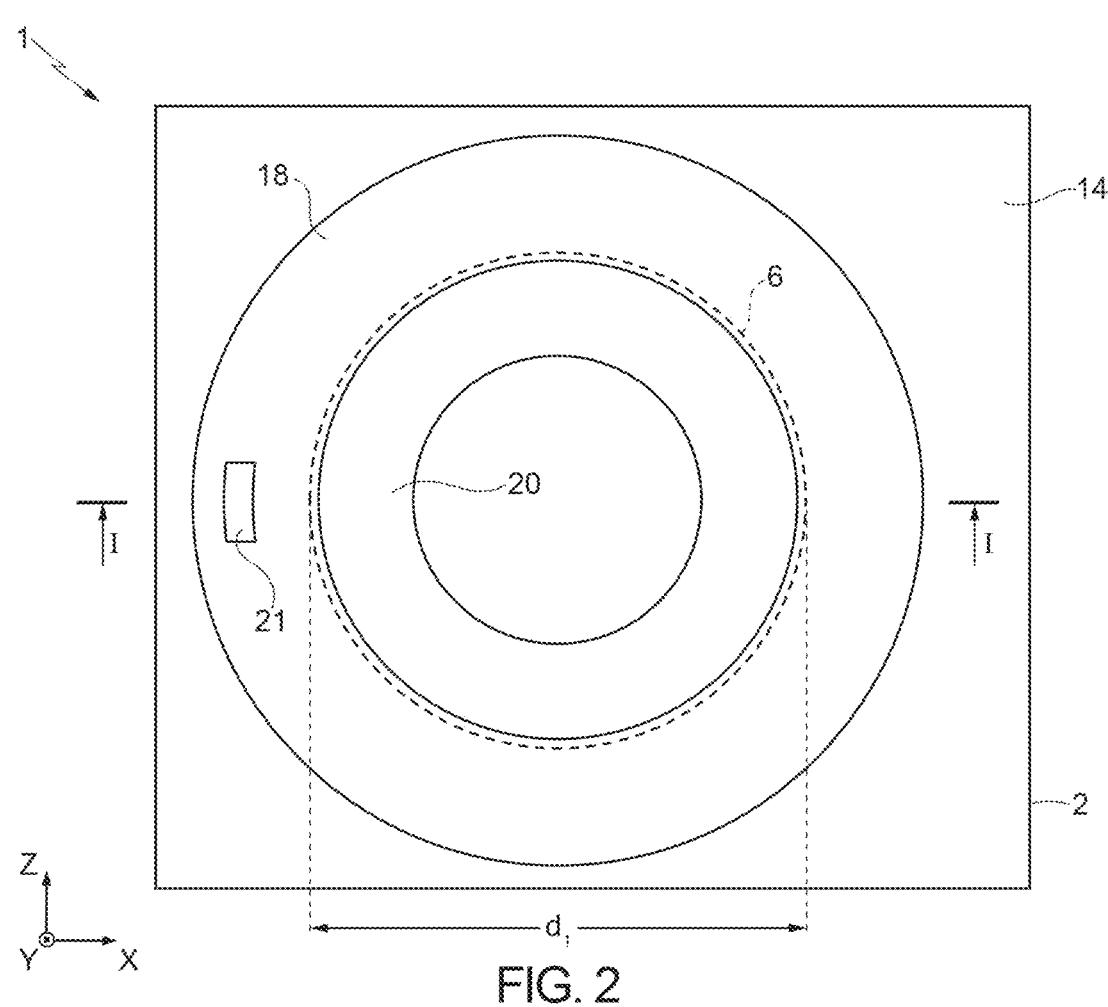
FIG. 2 is a top view of the PMUT of FIG. 1.

The cross-sectional view of FIG. 1 is represented in a system of Cartesian axes X, Y, and Z orthogonal to one another, and is taken along a line of section I-I shown in FIG. 2. The PMUT 1 comprises a semiconductor body 2, including a substrate made of semiconductor material such as silicon, and one or more epitaxial regions, which are also made of semiconductor material such as silicon, grown on the substrate. The semiconductor body 2 has a first face 2a and a second face 2b, opposite to one another along the axis Z. A buried cavity 6, having by way of example a circular shape in the plane XY, extends within the semiconductor body 2 and is separated from the first face 2a by a membrane 8 at least in part suspended over the cavity 6. Also the membrane 8 has, in this embodiment provided by way of example, a circular shape in the plane XY.

In a way in itself known, optionally extending on the first face 2a of the semiconductor body, in an area corresponding to the membrane 8, is an interface layer 14 (made, for example, of silicon oxide) and extending over the latter is a stack formed by a bottom electrode 16, a piezoelectric 18 (for example, lead zirconate titanate (PZT) or aluminum nitride (AlN)), and a top electrode 20. The interface layer 14 has the function of electrical insulator between the bottom electrode 16 and the semiconductor body 2 and moreover has the function of generating a compressive stress, at the membrane 8, which opposes a possible collapse of the membrane 8 towards the inside of the cavity 6 on account of an excessive difference in pressure between the pressure inside the cavity 6 and the environmental pressure outside it.

In one embodiment, the bottom electrode 16 and the piezoelectric 18 have, in a view in the plane XY, a circular shape with respective diameters equal to or greater than the diameter $d_1$ of the cavity 6. The piezoelectric 18 moreover has a through opening 21, exposed through which is a surface portion of the bottom electrode 16, to enable subsequent electrical contact of the latter. The top electrode 20 has a doughnut circular shape and extends at edge regions of the membrane 8. It is evident that, in different embodiments, not illustrated, the top electrode 20 may have a different shape, for example a full circular shape, and may extend to cover the entire surface of the membrane 8 or just a part thereof (for example, the top electrode 20 is concentric to the membrane 8 but has a diameter smaller than that of the membrane 8). In use, when an a.c. current/voltage is supplied to the top electrode 20 and bottom electrode 16 in order to activate the piezoelectric 18, a deflection of the membrane 8 along Z is generated.

In general, the PMUT 1 can function both as a transmitter and as a receiver. As a transmitter, the electrical field between the top electrode 20 and the bottom electrode 16 generates a transverse stress in the piezoelectric 18 on account of the inverse piezoelectric effect. The stress thus generated causes a bending moment that forces the membrane to deflect out of the plane XY, generating a variation of pressure in the environment in which the PMUT 1 is inserted, which propagates as a pressure wave in the medium considered (e.g., air), in a main direction of propagation parallel to the axis Z, away from the PMUT 1. As a receiver, an incident pressure wave causes a deflection of the membrane and creates a transverse stress that results in a variation of electrical charge between the top electrode and the bottom electrode, via the piezoelectric effect.

As may be noted, the membrane 8 of the PMUT 1 does not deflect only statically but, in use, when the electrodes 16 and 20 are biased by means of an appropriate a.c. voltage (e.g., a sinusoidal wave or a square wave), the membrane 8 vibrates at a specific frequency (resonance frequency $f_0$). The mass of the membrane 8 itself affects the dynamic behavior, as a function of its density p. Also the resistance (acoustic impedance) offered by the medium (e.g., air) in which the membrane 8 vibrates affects the frequency of vibration (in the case of air, this parameter may be neglected). Further important parameters regard the shape of the membrane, its thickness, and its diameter.

On account of this multi-domain dependence, the resonance frequency $f_0$ of the vibrating membrane of a PMUT is typically characterized via finite-element modelling (FEM) software, exploiting appropriate computer programs available to the person skilled in the art. However, to a first approximation, the resonance frequency $f_0$, in particular for a membrane 8 of a shape (in top plan view, in the plane XY) chosen from among circular, quadrangular (e.g., square), and polygonal, may be considered as being proportional to the ratio $(t_1/L^2)$, where $t_1$ is the thickness of the membrane 8, and L is a characteristic dimension of the shape chosen for the membrane 8 (i.e., the diameter $d_1$ in the case of a circular membrane, the side or diagonal in the case of a square membrane, or the diagonal in the case of a polygonal membrane), or some other characteristic dimension chosen according to the need. It is evident that the characteristic dimension of the membrane 8 may be different from the one indicated above; in particular, it may be a dimension linked by a proportionality factor with the dimensions indicated above (e.g., radius and diameter in the case of a circular membrane; side and diagonal in the case of a square; etc.).

More precisely, the resonance frequency $f_0$ for a circular membrane may be evaluated using the following Eq. (1), considering air as the medium in which the membrane 8 is immersed:

$$f_0 = \frac{B}{2\pi}\sqrt{\frac{E \cdot t_1^2}{\rho \cdot d_1^4 \cdot (1-\nu)}} \qquad (1)$$

where E is Young's modulus, ρ the density of the material of which the membrane is made, and ν is Poisson's ratio. The parameter B is a constant defined on the basis of the configuration chosen for the membrane anchorages, and is in particular equal to: 11.84 for a membrane constrained at the edges (thus preventing rotation and translation of the membrane at the edges); 6.09 for a membrane free at the edges and without constraint (ideal case, which can be used during a simulation); 4.35 for a membrane constrained at the center and free at the edges; and 5.90 for a membrane hinged at the edges, i.e., designed to enable translation, but not rotation, at the edges.

In an embodiment of the present disclosure, provided purely for purposes of non-limiting description, the membrane 8 is considered as being sized so as to obtain a resonance frequency of 95 kHz, and in particular with a circular shape, in a view in the plane XY, and with a diameter $d_1$=500 μm (the other parameters are chosen accordingly).

A further indication useful for characterizing the membrane 8 regards the maximum deflection amplitude. This depends upon the materials used for forming the membrane, as well as upon its thickness and the intensity of the mechanical command imparted by the piezoresistor 18 to the membrane 8. In this example, provided purely by way of description, maximum deflection of the membrane 8 along Z is considered as being ±1 µm with respect to the condition of zero deflection (i.e., with membrane not actuated).

Moreover, the quality factor Q, which is representative of the bandwidth of the PMUT 1, is considered as being comprised between 94.2 kHz and 95.8 kHz, in particular 100 kHz.

It is evident that, to obtain resonance frequencies of a value different from 95 kHz, at least the parameters for the shape of the membrane 8 and the values of $d_1$ and $t_1$ can be modified. Variation of said parameters, to obtain a specific resonance frequency, is within the reach of the person skilled in the art, possibly via the aid of FEM design software of a known type.

In general, according to an aspect of the present disclosure, it is possible to design the PMUT 1 by setting the following parameters. The cavity 6 has a diameter $d_1$ comprised between 50 µm and 800 µm and a maximum thickness $d_2$, along Z, comprised between 200 µm and 5 µm. The membrane 8 has a thickness $t_1$, measured between the cavity 6 and the first face 2a, of a few microns, for example between 1 µm and 5 µm.

Figure 3:
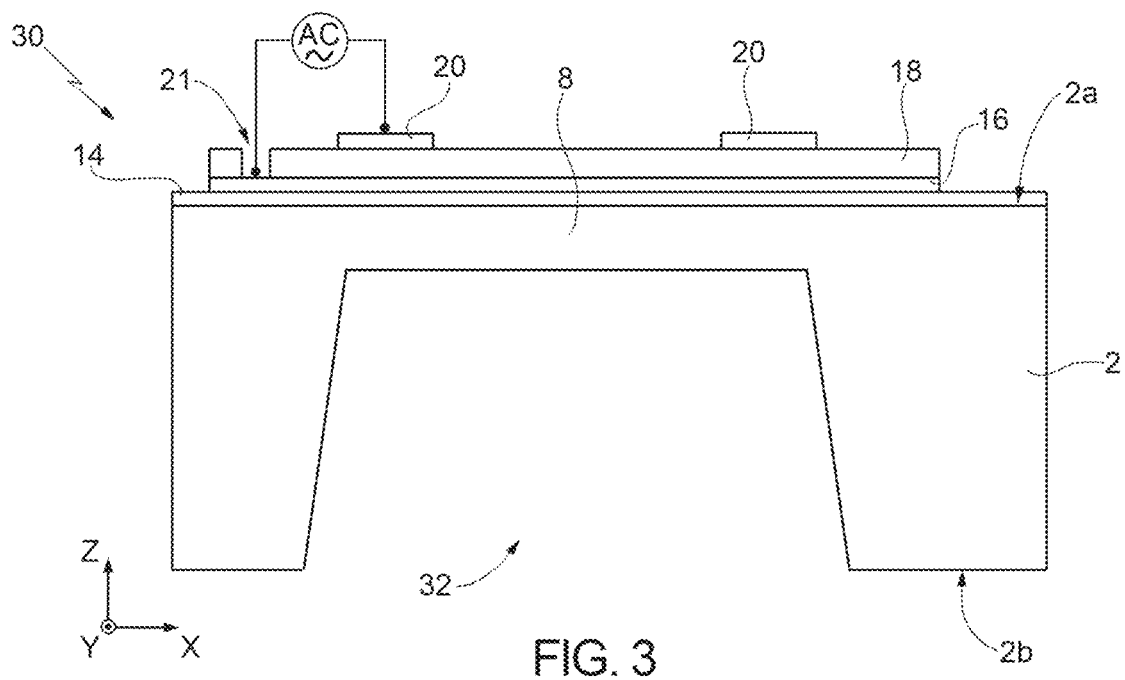
FIG. 3 illustrates a PMUT according to a further embodiment of a known type.

FIG. 3 illustrates a PMUT 30 according to an embodiment alternative to that of FIG. 1. In this case (elements that are in common are identified by the same reference numbers and are not described any further), the cavity 6 of a buried type is not present and is instead replaced by a cavity 32 that extends through the semiconductor body 2 starting from the second face 2b. In this embodiment, the cavity 32 is at the same pressure as the environment in which the PMUT is arranged in use. Any drawbacks due to a possible collapse of the membrane 8 on account of an excessive difference in pressure between the pressure inside the cavity 6 and the environmental pressure outside it are thus overcome.

FIGS. 1 and 2 illustrate by way of example a single PMUT 1. However, for the purpose of emitting an ultrasound wave with specific directivity and long propagation distance (e.g., between 1 and 2 m), it is possible to provide an emitter device including linear or two-dimensional arrays (in general, "arrays") of PMUTs 1 arranged according to a specific pattern, for example a circular or linear pattern as described by Kaoru Yamashita, et al. in "Arrayed ultrasonic microsensors with high directivity for in-air use using PZT thin film on silicon diaphragms," Sensors and Actuators, A 97-98 (2002), p. 302-307, or else as illustrated by way of example in FIGS. 7A and 7B.

Figure 4:
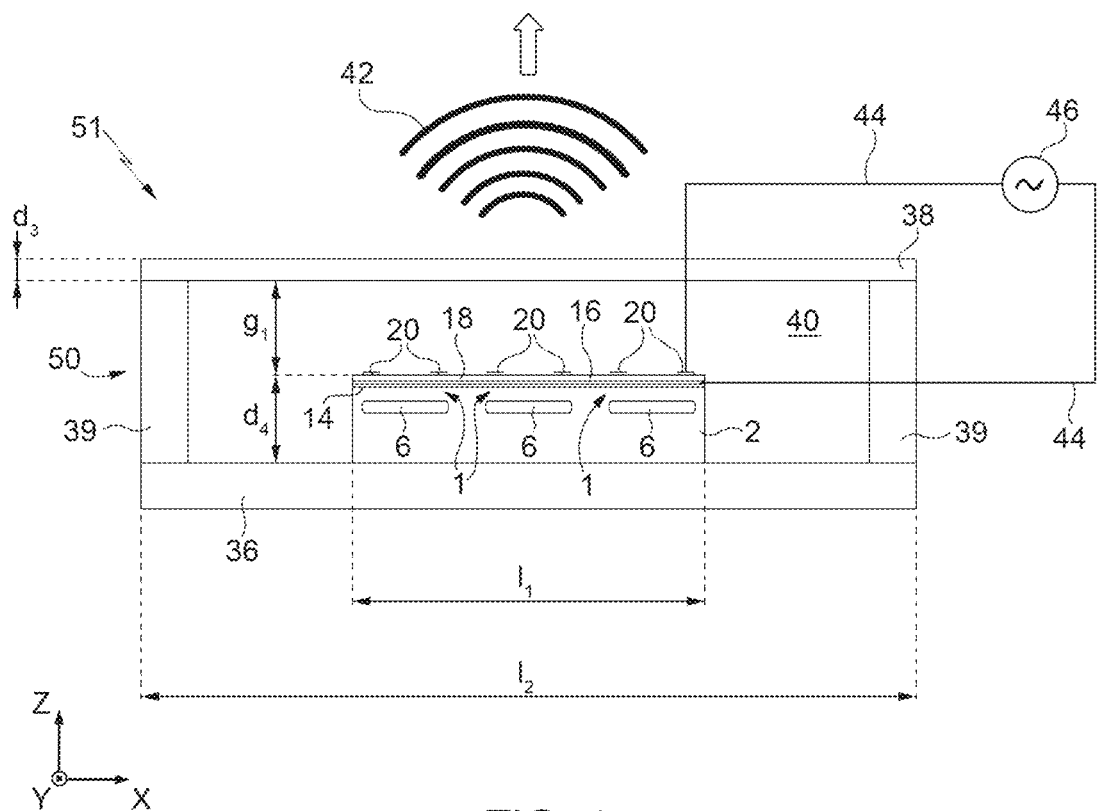
FIG. 4 illustrates a transmitter based upon PMUTs including a package that houses inside it a die integrating a plurality of PMUTs of the type shown in FIG. 1.

FIG. 4 shows schematically, in lateral sectional view, a package 50 that houses a die 35, which in turn houses or integrates a plurality of PMUTs 1 of the type shown in FIG. 1. The package 50 comprises a base substrate 36 and a protective cap 38, which is coupled to the base substrate 36 by means of coupling regions 39 and defines therewith an inner cavity 40 of the package 35. It is evident that, in an alternative embodiment, the cap 38 and the coupling regions 39 may be a monolithic body. In a non-limiting embodiment of the present disclosure, the walls of the cap 38 and of the coupling regions 39 facing the cavity 40 are rigid (in this context, by the term "rigid" is understood a material that does not undergo deformation under the action of the acoustic waves generated, in use, by the PMUTs 1 of the die 35). For example, if the cap 38 and the coupling regions 39 are chosen of metal (e.g., aluminum cap) or polymeric material, or semiconductor material (e.g., silicon), they are "rigid" when subjected to acoustic pressures in the range between $10^2$ Pa and $10^5$ Pa.

The base substrate 36 may be made of a laminated material such as FR-4 (glass epoxy laminate) or BT (bismaleimide triazine), or generically of plastic material or, again, of semiconductor material.

In this embodiment provided by way of example, the die 35 has a square shape, with a side $l_1$ (along X and Y) of approximately 7.15 µm, a radius $d_1$ (in the plane XY) of each membrane 8 of each PMUT 1 of approximately 500 µm, a thickness $d_4$ of the die 35 (along Z) of approximately 400 µm. Moreover, a cap 38 of a substantially square shape is here considered, with a side $l_2$ (along X and Y) of approximately 10 mm, and a thickness $d_3$ (along Z) of approximately 150 µm. The distance $g_1$ between the die 35 and the cap 38 is approximately 500 µm. The cavity 40 internal to the package 50 has an extension, in view in the plane XY, of a square shape. The volume of the cavity 40 internal to the package 50 is, for example, 50 mm³.

Moreover, in this example of embodiment, the die 35 houses nine PMUTs 1. In particular, the die 35 houses nine PMUTs 1 integrated in one and the same semiconductor body 2, and provided in the form of membranes that are arranged side by side and can be driven by respective piezoelectric actuators.

The package 50 and the die 35 form, together, an ultrasonic-transducer device 51.

In a way illustrated only schematically in FIG. 4, moreover present are electrical connections 44 for biasing the piezoresistors 18 by means of one or more respective voltage generators 46, configured to generate a voltage signal Vp.

As discussed above, the shape and size of the cavity 40 have an impact on the power of the acoustic wave emitted by the ultrasonic-transducer device 51, in particular on account of the acoustic-resonance modes that are generated within the cavity 40 during operation of the PMUTs 1 carried by the die 35.

Figure 5:
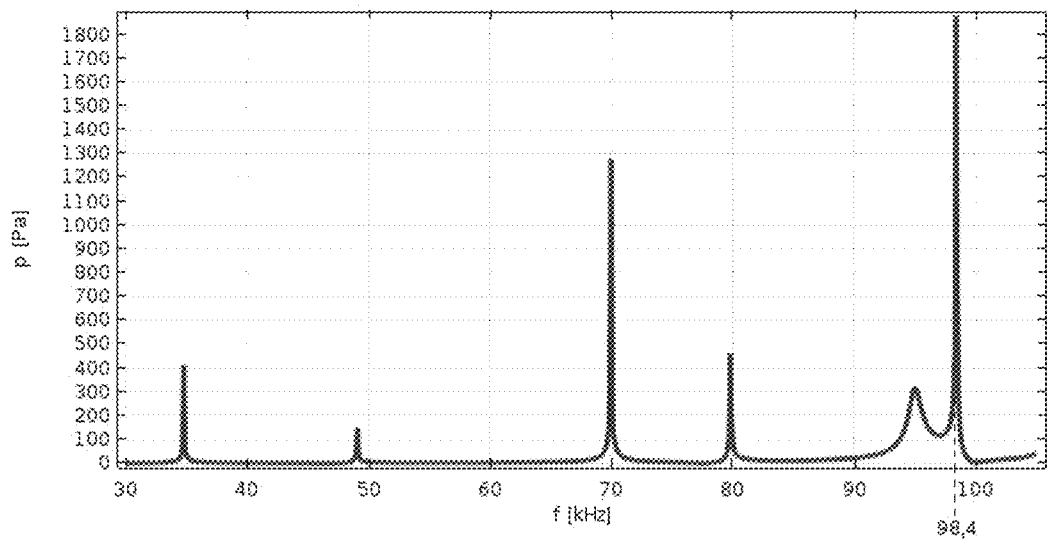
FIG. 5 shows, for different frequency values, the pressure exerted in a propagation medium (here, air) by acoustic-resonance waves generated, in use, by the plurality of PMUTs of FIG. 4.

The present applicant has found that the resonance frequency of the PMUTs 1 has an effect, in terms of power of the pressure wave 42 generated at output, that can be considered negligible with respect to the effect of the further (undesired) pressure waves that are generated at output as a result of the acoustic-resonance modes originated in the cavity 40. Said further pressure waves are transmitted by the device 51, each at a frequency of its own. As is, for example, illustrated in FIG. 5, by driving the PMUTs 1 of the die 35 in oscillation at the frequency of 95 kHz (in this example, this frequency is the resonance frequency of each of the PMUTs 1) and analyzing the acoustic waves 42 emitted by the ultrasonic-transducer device 51 in a wide range of frequencies (here, between 25 kHz and 110 kHz), there may be noted a plurality of peaks at various frequencies, each of which corresponding to an acoustic-resonance mode present in the cavity 40. As may be noted, the pressure generated in the medium (here air) at the frequency of 95 kHz is negligible with respect to the pressure generated in the same medium at the frequencies of 70 kHz and 98.4 kHz.

Consequently, according to an aspect of the present disclosure, each PMUT 1 of the die 35 is designed so that its resonance frequency $f_0$ matches substantially (i.e., with a margin of error given by the limitations of the manufacturing processes with respect to the theoretical design) the resonance frequency of one of the acoustic-resonance modes present in the cavity 40. The choice of the acoustic-resonance mode can be left to the freedom of the person skilled in the art. However, it is advisable for frequency matching to be made by choosing the acoustic resonance frequency that generates the highest output pressure in order to maximize the power of the acoustic signal 42 emitted (in the example considered in FIG. 5, the frequency of 98.4 kHz).

In the example considered, which is to be understood as in no way limiting the scope of the present disclosure, each PMUT 1 housed in the die 35 can be designed in a way in itself evident to the person skilled in the art, by designing the membrane 8 in order to obtain a resonance frequency of 98.4 kHz (e.g., following the formula indicated above for the resonance frequency $f_0$, including shape, material, thickness $t_1$, and diameter or diagonal $d_1$ of the membrane 8).

It is evident that the inventive idea underlying the present disclosure is not limited to the specific values mentioned previously. In fact, differences in shape, internal geometry, volume, and materials of the cavity 40 entail a consequent variation of the acoustic resonance frequencies in the cavity 40 corresponding to pressure peaks of the type illustrated in FIG. 5. Consequently, also the design of each PMUT 1 will have to take into account said variations, in order to design the PMUT 1 with a resonance frequency $f_0$ that matches the desired acoustic resonance frequency. Consequently, a person skilled in the art, by varying the parameters mentioned above (in particular at least one from among: shape of the membrane, material/materials of the membrane, thickness of the membrane, diameter or diagonal of the membrane), can design PMUTs with a precise resonance frequency, in particular, according to the present disclosure, a frequency equal to the acoustic resonance frequency chosen.

As regards the analysis of the resonance frequencies of the acoustic modes internal to the package 50, also this is within the reach of the person skilled in the art in so far as it can be carried out in an automated way, transparent for the user, by means of common FEM software, for any geometry chosen for the package 50.

Figure 6:
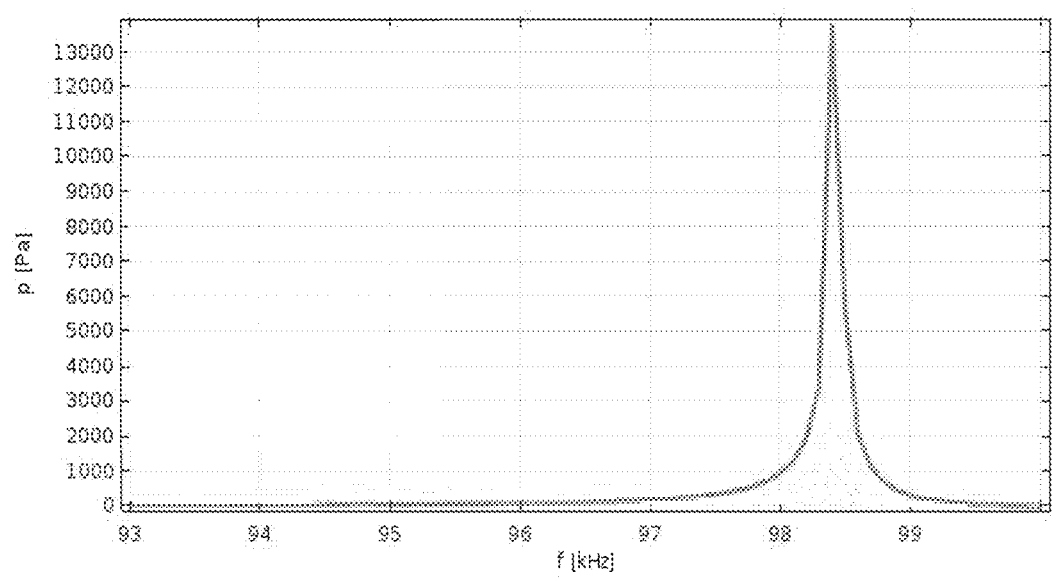
FIG. 6 shows the pressure exerted in a propagation medium (here air) by an acoustic wave emitted by the transmitter of FIG. 4 when improved according to an aspect of the present disclosure.

The present applicant has found that, by designing an ultrasonic transducer 51 according to the general teaching of the present disclosure, the power (in terms of pressure in the medium considered) of the acoustic wave 42 generated in the case of frequency matching is considerably higher than the power of the wave generated by driving the PMUTs 1 at their own resonance frequency but in the absence of matching. For this purpose, consider the graph in FIG. 6, from which there may be noted the amplitude of the pressure generated in the medium considered (here, once again air) in the case of frequency matching, as described above.

It should be noted that the pressure of the acoustic wave generated in the presence of matching, here at 98.4 kHz, is higher by one order of magnitude than the pressure generated by the acoustic wave, once again at 98.4 kHz, produced by the sole effect of the acoustic resonance in the cavity 40, and by two orders of magnitude than the pressure generated by the acoustic wave produced by designing the PMUTs 1 so as to operate at the resonance frequency of 95 kHz.

Figure 7A:
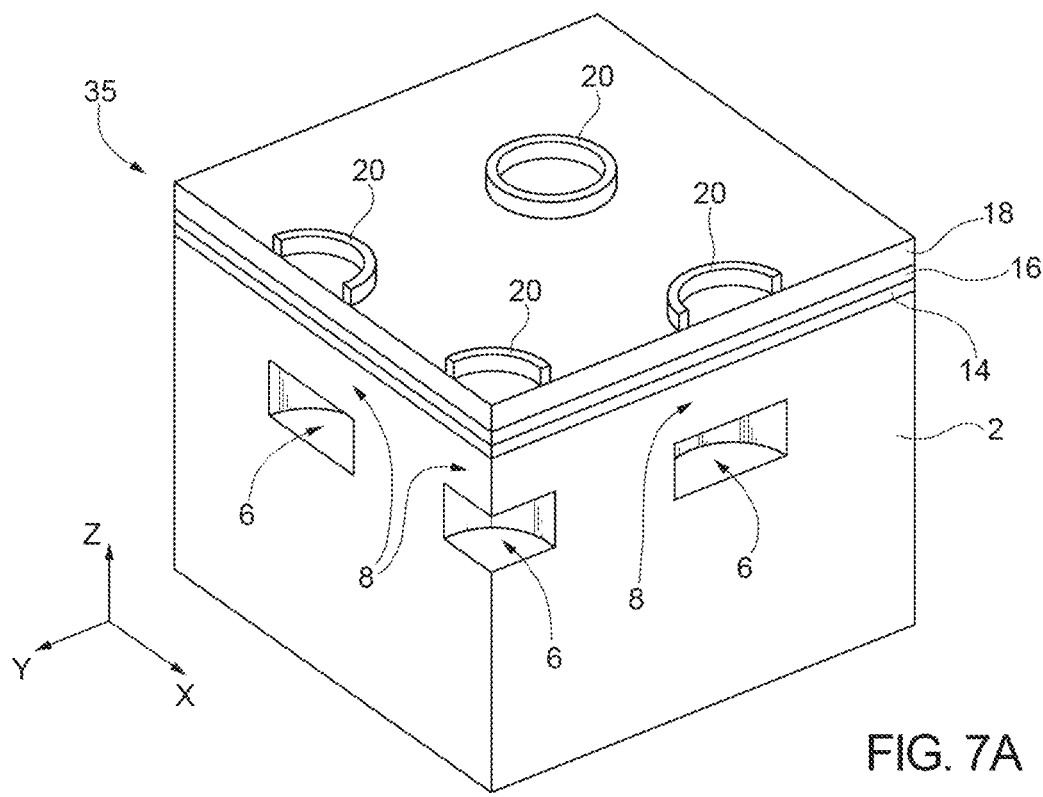
FIG. 7A is a perspective view of a portion of the die integrating the plurality of PMUTs of FIG. 4, according to an embodiment provided by way of non-limiting example of the present disclosure.
Figure 7B:
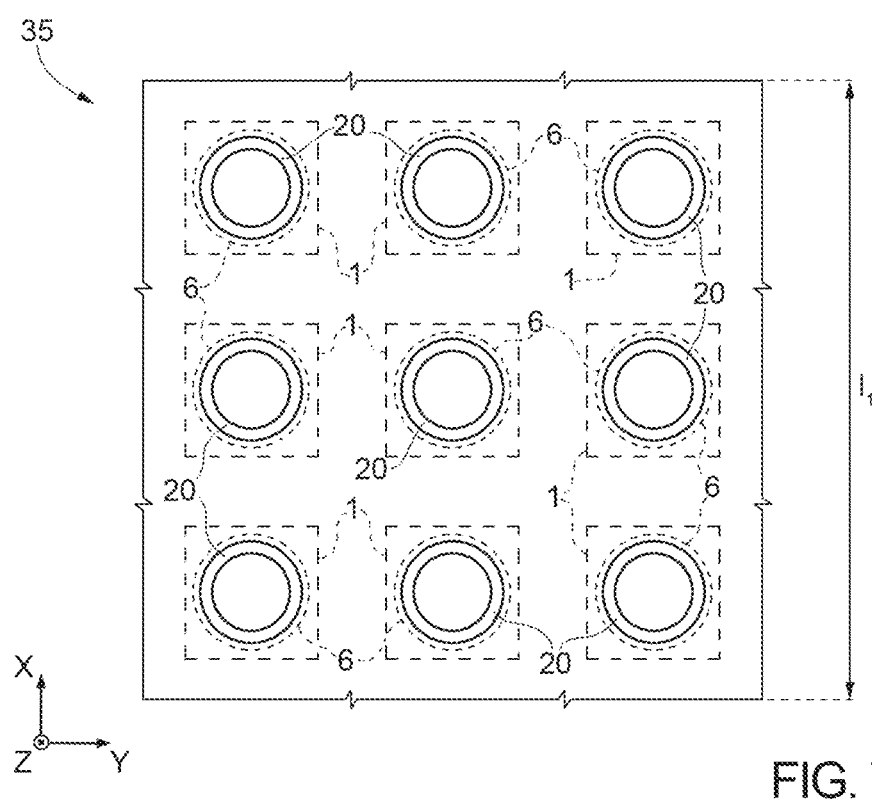
FIG. 7B is in top plan view of the die integrating the plurality of PMUTs of FIGS. 4 and 7A, according to an embodiment provided by way of non-limiting example of the present disclosure.

FIG. 7A is a sectioned perspective view of a portion of the die 35, whereas FIG. 7B is a top plan view, in the plane XY, of the die 35, from which the mutual arrangement of the membranes of each of the PMUTs 1 housed in the semiconductor body 2 may be appreciated.

According to a further aspect of the present disclosure, in addition to the aforementioned frequency matching, the layout of the PMUTs 1 in the die 35, as likewise the spatial location of the die 35 in the package 50, are chosen as a function of the acoustic-resonance modes generated within the cavity 40. In particular, once an acoustic resonance frequency with which to carry out matching of the resonance frequency of the PMUTs 1 has been chosen (e.g., one of the frequencies identified by the peaks in FIG. 5), the acoustic pressure exerted on the cap 38 is examined, for example by means of FEM simulation (in particular, by means of modal analysis using a simulation software such as Comsol Multiphysics®).

Figure 8:
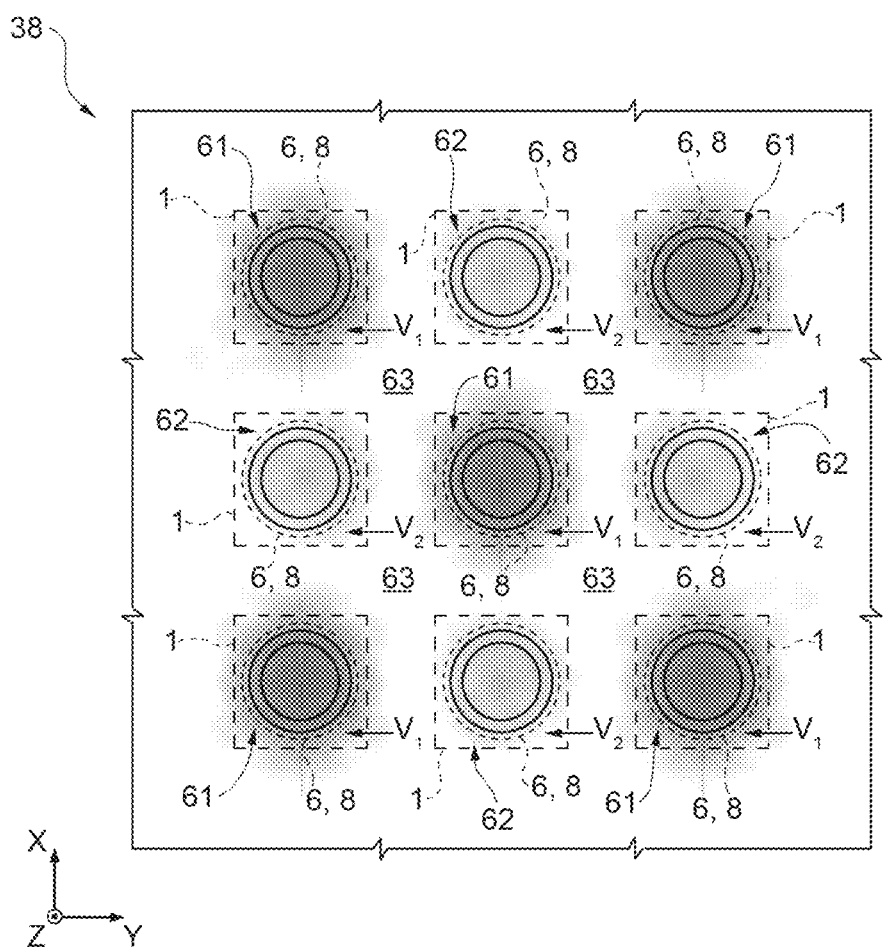
FIG. 8 illustrates, according to the same view as that of FIG. 7B, a portion of the transmitter based upon PMUTs of FIG. 4, where shades of grey represent graphically the pressure transmitted by the propagation medium (here air) to the cap of the package of FIG. 4.

FIG. 8 shows, by way of example, regions of the cap 38 subjected to different pressures, caused by the acoustic-resonance modes of the cavity 40, obtained via FEM simulation. The areas designated by the reference number 61, in dark shades of grey, are regions in which the pressure is positive, i.e., oriented in the positive direction of the axis Z, whereas the areas designated by the reference number 62, in light shades of grey are regions in which the pressure is negative, i.e., oriented in the negative direction of the axis Z. Transition regions 63, represented white in FIG. 8, are in any case present between the areas 61 and the areas 62.

The choice of the particular layout illustrated in FIG. 7B, and reproposed in FIG. 8, regarding the specific arrangement of the PMUTs 1, is a function of the pressure exerted, on the cap 38, by the acoustic waves generated in the cavity 40 and impacting on the cap 38 on the side of the latter facing the cavity 40.

As may be noted, there exist areas 61 and areas 62 in which the pressure has an opposite sign, and intermediate areas 63 in which the pressure has a negligible value. Areas 61 and 62 can be identified irrespective of the presence of the PMUTs, through a simulation during the design phase by imposing at least one acoustic wave (i.e., a cumulative acoustic wave, not the waves actually generated, during use, by the PMUTs) directed toward the cap 38 from the region of the device designed to house the PMUTs. The presence and spatial arrangement of the areas 61 and 62 are a function of the shape/volume of cavity 40 (as a consequence of the reciprocal arrangement of the cap 38 and the base substrate 36), and of the frequency of the acoustic wave(s) in the cavity 40.

In the example shown, when a maximum pressure is at the areas 61 a corresponding minimum pressure is at the areas 62 with a resonance oscillation frequency, as said, of 98.4 kHz.

According to an aspect of the present disclosure, each PMUT is formed in a specific area of the die 35, and likewise the die 35 is arranged in the cavity 40 of the package, so that each membrane 8 of each PMUT 1 is substantially aligned, along Z (i.e., in the main direction of propagation of the acoustic wave 42 emitted), to a respective one between the area 61 and the area 62. By driving appropriately each PMUT 1 with a signal $V_1$ that causes a vibration of said membrane 8 at the resonance frequency chosen for the respective PMUT 1 (as previously described and following the example proposed, at 98.4 kHz so as to correspond to the resonance frequency of the acoustic mode chosen), it is possible to maximize the pressure exerted in the areas 61, thus obtaining a considerable increase in the pressure exerted, in the propagation medium considered, by the acoustic wave emitted by the ultrasonic-transducer device 51. In a way in itself evident, excitation of each PMUT 1 occurs in phase with the acoustic vibrational mode considered, so as to maximize the pressure effect on the cap 38 and, consequently, the energy emitted.

The membranes 8 of the remaining PMUTs 1, i.e., those corresponding to the areas 62 in which the pressure is minimum, are driven with a respective signal $V_2$ that is in phase opposition with respect to the driving signal $V_1$ of the PMUTs 1 aligned to the areas 61.

Figure 9:
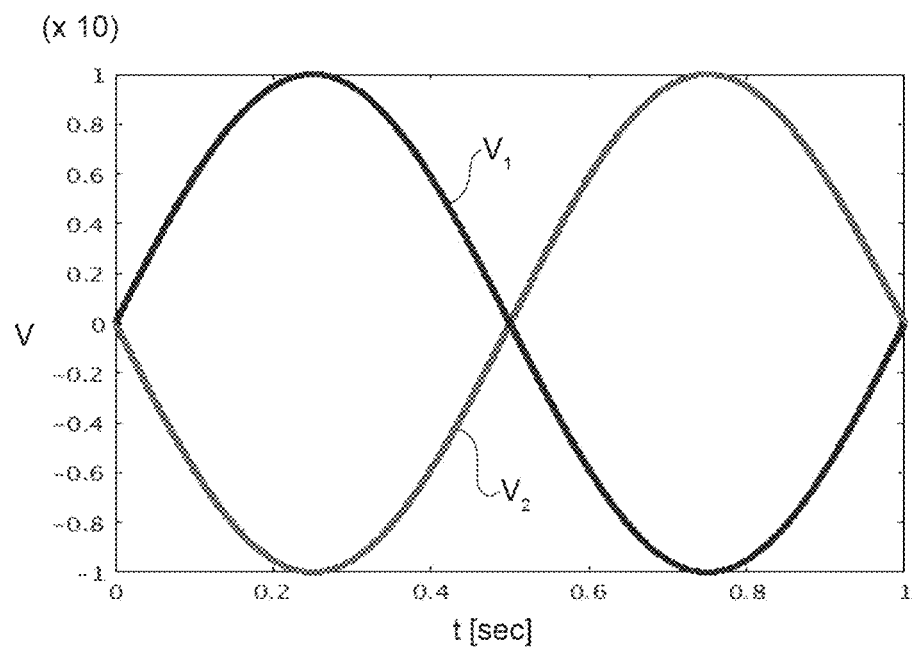
FIG. 9 shows control signals of the PMUTs when these are arranged as illustrated in FIG. 8.

FIG. 9 is a graphic representation of the driving signals $V_1$ and $V_2$, here of a sinusoidal type. Alternatively, it is possible to use signals of a square-wave type.

Other driving methods, different from the ones described with reference to FIGS. 8 and 9, may be used.

For example, once again with reference to FIG. 8, it is possible to drive exclusively the PMUTs 1 located in positions corresponding to the areas 61 (said PMUTs are made to vibrate in phase with the resonant acoustic wave at the frequency of 98.4 kHz considered). The remaining PMUTs 1, located in positions corresponding to the areas 62, are kept turned off. This embodiment presents the advantage of enabling an increase in the pressure of the acoustic wave 42 emitted as compared to the known art, but with a saving in terms of consumption as compared to the case previously described with reference to FIGS. 8 and 9.

According to a further embodiment, it is likewise possible to drive only some, or just one, of the PMUTs 1 located in positions corresponding to the areas 61 (said PMUTs are made to vibrate in phase with the resonant acoustic wave at the frequency of 98.4 kHz considered), whereas all the others are kept turned off.

Finally, even though it is possible to drive all the PMUTs 1 simultaneously with one and the same voltage signal (for example, by applying just the voltage signal $V_1$ or just the voltage signal $V_2$), this embodiment does not lead to particular advantages.

Figure 10:
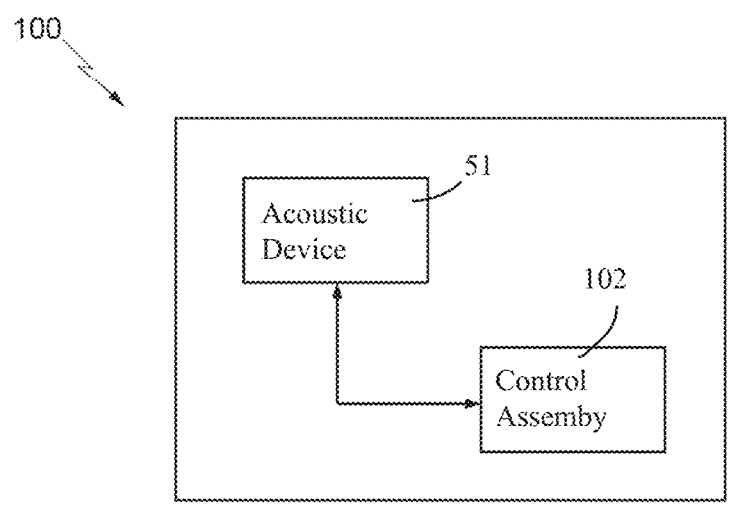
FIG. 10 illustrates schematically an electronic system including one or more PMUTs according to any one of the embodiments of the present disclosure.

FIG. 10 is a schematic illustration of an electronic system 100 including the ultrasonic transducer 51. The electronic system 100 moreover includes a control assembly 102 for control of the array of PMUTs, configured to bias, in an operating condition in which the array of PMUTs functions as transmitter, the bottom and top electrodes 16, 20 of each PMUT of the array in order to cause a deflection of the respective piezoelectric 18 and, consequently, a controlled deflection of the membrane 8, according to what has been described previously.

The control assembly 102 for controlling the array of PMUT is likewise configured to receive and process, in an operating condition in which the array of PMUTs functions as receiver, an electrical signal transduced by the piezoelectric 18 that is a function of a deflection of the membrane 8 caused by a pressure wave impacting on the membrane 8 of the PMUT.

In one embodiment, the control assembly 102 may be implemented using a microcontroller that includes a programmed processor together with appropriate digital-analog and analog-digital converters. Alternatively, the control assembly 102 may be implemented using a dedicated analog control circuit, or any other controller that can be configured to perform the functions discussed herein.

It is evident that, according to the operating context and tapplication, the electronic system 100 (and in particular the control assembly 102) may be configured to operate in just one of the two aforementioned operating modes.

The electronic system 100 is, for example, one of the following: a non-destructive testing system, a speed-detection system, an object-recognition system, an anti-collision system, and a medical-imaging system.

The advantages that can be achieved by the PMUTs according to the present disclosure, in the respective embodiments and according to the respective manufacturing methods, are evident from what has been described previously.

In particular, the disclosure described enables an embodiment of an array of PMUTs that is optimal for the purposes of generation of a wave emitted at high pressure.

Finally, it is clear that numerous modifications and variations may be made to the device described and illustrated, all of which fall within the scope of the present disclosure.

In particular, the present disclosure applies, in a way in itself evident to the person skilled in the art, also to capacitive micromachined ultrasonic transducers (CMUTs).

Moreover, it is evident that the embodiment of FIG. 4, in which a die 35 houses (integrates) a plurality of PMUTs 1, can be modified so that the die 35 houses just one PMUT 1 and/or so that the cavity 40 houses a plurality of dice each including one or more PMUTs 1.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for emitting an ultrasound acoustic wave in a propagation medium, comprising:
   a package including a base substrate and a cap coupled to the base substrate and defining therewith a chamber in the package;
   a semiconductor die coupled to the base substrate in the chamber and including a semiconductor body; and
   a micromachined ultrasonic transducer (MUT) integrated at least in part in the semiconductor body and including a cavity in the semiconductor body, a membrane suspended over the cavity, and an actuator operatively coupled to the membrane and operable for generating a deflection of the membrane,
   wherein said membrane is configured to have a resonance frequency that matches an acoustic resonance frequency that, during operation of the MUT, develops in said chamber of the package.

2. The device according to claim 1, wherein said membrane is made of a material chosen in a group including a semiconductor or dielectric material.

3. The device according to claim 1, wherein the membrane has a shape chosen from among: circular, quadrangular, and polygonal.

4. The device according to claim 1, wherein the membrane is circular, the membrane has a thickness comprised in a range between 1 µm and 5 µm, and the membrane has a diameter comprised in a range between 50 µm and 2 mm.

5. The device according to claim 1, wherein:
   the MUT is one of a plurality of MUTs integrated in the die,
   each MUT of said plurality includes: a respective cavity in the semiconductor body and a respective membrane suspended over the respective cavity; and a respective actuator operatively coupled to the respective membrane, each actuator being configured to generate a deflection of the respective membrane,
   each membrane is configured to have a respective resonance frequency that matches said acoustic resonance frequency.

6. The device according to claim 5, wherein each MUT and the die are arranged with respect to the cap so that each MUT is aligned to a respective one of plural regions of the cap that correspond, in use, to areas of either maximum or minimum pressure exerted, in the propagation medium, by the acoustic wave emitted at said acoustic resonance frequency.

7. The device according to claim 6, wherein each MUT integrated in the die is arranged with respect to the cap so that alignment of the respective MUTs to the respective regions of the cap is along a main direction of propagation of the acoustic wave emitted at said acoustic resonance frequency.

8. The device according to claim 1, wherein said MUT is a piezoelectric micromachined ultrasonic transducer.

9. An electronic system, comprising:
a package including a base substrate and a cap coupled to the base substrate and defining therewith a chamber in the package;
a semiconductor die coupled to the base substrate in the chamber and including a semiconductor body; and
an array of micromachined ultrasonic transducers (MUTs) integrated at least in part in the semiconductor body, each MUT including a cavity in the semiconductor body, a membrane suspended over the cavity, and an actuator operatively coupled to the membrane and operable for generating a deflection of the membrane, wherein said membrane is configured to have a resonance frequency that matches an acoustic resonance frequency that, during operation of the MUT, develops in said chamber of the package.

10. The system of claim 9, wherein said electronic system is one of the following: a non-destructive testing system, a speed-detection system, an object-recognition system, an anti-collision system, or a medical-imaging system.

11. The system according to claim 9, comprising a MUT controller configured to control the array of MUTs, the MUT controller being configured to cause, in a first operating condition, a deflection of one or more of the membranes such as to generate emission of a pressure wave and/or for acquiring, in a second operating condition, a transduced signal that is a function of a deflection of one or more of the membranes by a pressure wave received.

12. A method for manufacturing a device for emission of an ultrasound acoustic wave, comprising:
forming a package by coupling a cap on a base substrate and thereby defining a chamber in the package;
coupling a semiconductor die to the base substrate in the chamber, the semiconductor die including a semiconductor body;
forming, at least in part in the semiconductor body, a micromachined ultrasonic transducer (MUT), the forming of the MUT including:
forming a cavity in the semiconductor body;
forming a membrane suspended over the cavity; and
coupling an actuator to the membrane for generating, in use, a deflection of the membrane,
wherein said membrane is configured to have a resonance frequency that matches an acoustic resonance frequency that, during operation of the MUT, develops in said chamber of the package.

13. The method according to claim 12, wherein
forming the MUT includes designing at least one physical parameter of said membrane so that the resonance frequency of the membrane matches the acoustic resonance frequency that, during operation of the MUT, develops in said chamber of the package, and
designing said at least one physical parameter includes designing at least one of the following: shape, material, thickness, diameter, or diagonal of said membrane.

14. The method according to claim 13, wherein said membrane is made of a semiconductor or dielectric material.

15. The method according to claim 12, wherein said membrane has a shape that is one of: circular, quadrangular, or polygonal.

16. The method according to claim 13, wherein said designing of the at least one physical parameter of said membrane includes defining a shape of the membrane as circular, setting the thickness of the membrane in a range between 1 µm and 5 µm, and setting a diameter of the membrane in the range between 50 µm and 2 mm.

17. The method according to claim 13, wherein forming the MUT is part of forming a plurality of MUTs in the die, which includes: forming, for each MUT, a respective cavity in the semiconductor body and a respective membrane suspended over the respective cavity; and forming, for each MUT, a respective actuator, which can be operated for generating a deflection of the respective membrane,
wherein said at least one physical parameter of each membrane of the plurality of MUTs, is configured so that a resonance frequency of the membrane corresponds to said acoustic resonance frequency.

18. The method according to claim 17, further comprising arranging each MUT in the die, and arranging the die, with respect to the cap, so that each MUT is aligned to a respective one of regions of the cap that correspond, in use, to areas of maximum or minimum pressure exerted by the acoustic wave emitted at said acoustic resonance frequency.

19. The method according to claim 18, wherein arranging the MUTs comprises arranging each MUT, with respect to the cap so that said MUT is aligned in a main direction of propagation of an acoustic wave emitted at said acoustic resonance frequency.

20. The method according to claim 12, wherein said MUT is a piezoelectric micromachined ultrasonic transducer or a capacitive micromachined ultrasonic transducer.

21. A device, comprising:
a package including a base substrate, a cap coupled to the base substrate, and a chamber;
a semiconductor body on the base substrate and in the chamber, the semiconductor body having a first face and a second face opposite to the first face;
a cavity in the semiconductor body;
a membrane in the semiconductor body and directly overlying the cavity;
a first electrode on first face;
piezoelectric on the first electrode; and
a plurality of second electrodes on the piezoelectric and directly overlying the cavity, the membrane configured to vibrate at a resonance frequency in response to the first electrode and the plurality of second electrode being biased.

22. The device according to claim 21, wherein the cavity is a buried cavity in within the semiconductor body.

23. The device according to claim 21, wherein the cavity extend through the second face of the semiconductor body.

24. The device according to claim 21, wherein each of the plurality of second electrodes has a circular shape extending at edge regions of the membrane.

* * * * *